United States Patent [19]

Archer et al.

[11] 4,438,192

[45] Mar. 20, 1984

[54] PHOTORESIST STRIPPER COMPOSITION AND METHOD OF USE

[75] Inventors: Wesley L. Archer, Midland, Mich.; Vicki A. Lynn, Indianapolis, Ind.; Susan M. Dallessandro, Midland, Mich.

[73] Assignee: The Dow Chemical Company, Midland, Mich.

[21] Appl. No.: 465,975

[22] Filed: Feb. 14, 1983

[51] Int. Cl.$^3$ .................... B08B 3/08; C11D 7/50; C23G 5/02

[52] U.S. Cl. ...................... 430/329; 134/38; 252/153; 252/162; 252/170; 252/172; 430/260; 430/331

[58] Field of Search ............. 252/153, 162, 170, 172; 134/38; 156/DIG. 904, 659.1; 430/524, 260, 331, 329; 570/111, 117

[56] References Cited

U.S. PATENT DOCUMENTS

| | | | |
|---|---|---|---|
| 3,075,923 | 1/1983 | Berst et al. | 252/144 |
| 3,113,154 | 12/1963 | Trotter | 252/172 |
| 3,147,224 | 9/1964 | Gauntt et al. | 252/143 |
| 3,600,322 | 8/1971 | Morison | 252/171 |
| 3,625,763 | 12/1971 | Melillo | 134/38 |
| 3,650,969 | 3/1972 | Baltakmens | 252/143 |
| 3,789,007 | 1/1974 | Robinson | 252/171 |
| 3,813,309 | 5/1974 | Bakos et al. | 156/2 |
| 3,988,256 | 10/1976 | Vandermey et al. | 134/38 X |
| 4,187,191 | 2/1980 | Simpson, Jr. | 134/38 X |
| 4,211,560 | 7/1980 | Taguchi et al. | 430/524 X |
| 4,246,130 | 1/1981 | Koch | 134/38 X |
| 4,269,724 | 5/1981 | Hodson | 252/171 |
| 4,278,557 | 7/1981 | Elwell, Jr. | 252/171 |
| 4,301,230 | 11/1981 | Taguchi et al. | 430/534 X |
| 4,360,582 | 11/1982 | Taguchi et al. | 430/273 X |
| 4,367,324 | 1/1983 | Zweifel et al. | 430/630 X |

*Primary Examiner*—John E. Kittle
*Assistant Examiner*—Mukund J. Shah
*Attorney, Agent, or Firm*—A. C. Ancona

[57] ABSTRACT

An improved process for removing crosslinked photoresist polymer from printed circuit boards which comprises contacting the printed circuit board with methylene chloride containing from about 5 to about 10 volume percent of a mixture of methanol and methyl formate. Each additive must be present at a minimum concentration of one volume percent. Stabilizers for the methylene chloride, such as epoxides, may be present at amounts no greater than about 0.5 volume percent.

9 Claims, No Drawings

PHOTORESIST STRIPPER COMPOSITION AND METHOD OF USE

BACKGROUND OF THE INVENTION

Printed circuit boards are manufactured by plating a thin layer of copper on an epoxy-glass cloth laminate board of uniform thickness. A predetermined pattern of holes is then drilled to accommodate various electrical components. A film of partially polymerized photoresist plastic is deposited on the laminate over the copper plating. Photoresist films are commonly composed of acrylic resins, polyvinyl cinnamates, diazo compounds, phenol-formaldehydes, or other similar film-forming materials. This film is further polymerized, or crosslinked, by the action of ultraviolet light, into a hard chemically resistant film.

By masking with an appropriate glass or plastic material the resist film is selectively hardened by the exposure to light in specific predetermined areas, while the resist film in the masked areas is left unchanged. The unchanged resist film is then dissolved in a "developer" by a solvent such as 1,1,1-trichloroethane or a solution of butoxyethanol and sodium carbonate or similar solutions. The copper in the cleaned areas may then be removed by etching or additional copper and other metals may be plated thereon. In either event, it then becomes necessary to remove the exposed hardened resist film from the laminate.

It is known that such resist films can be removed by the action of strong organic solvents, such as methylene chloride or trichloroethylene.

It is known also that many paint and varnish removers are based on methylene chloride. Many of these also contain an alcohol and one or more other additives. Thus, U.S. Pat. No. 3,650,969 discloses a composition for removing paint which comprises dichloroalkanes of 1 to 2 carbon atoms, an aliphatic monohydric alcohol containing 1 to 3 carbon atoms, and hydrogen flouride and water. U.S. Pat. No. 3,600,322 discloses a paint remover composition containing methylene chloride, methanol and a quaternary nitrogen cellulose ether.

Other patents employing methylene chloride with alkanols and various other additives are U.S. Pat. Nos. 3,147,224; 3,075,923; 4,269,724 and 4,278,557.

A method of removing resist from printed circuit boards is described in U.S. Pat. No. 3,789,007 wherein the board is treated with a mixture of 85 to 97% by weight of methylene chloride with the balance being methanol.

Other methylene chloride-containing photoresist stripper compositions are disclosed in U.S. Pat. No. 3,625,763; 3,813,309 and 3,625,763.

SUMMARY OF THE INVENTION

The present invention is an improved photoresist stripper composition which contains methylene chloride, methanol and methyl formate. This combination strips the resist at a faster rate than prior art compositions. The preferred composition also provides a non-flashing mixture (blend) and gives better line definition than currently available commercial strippers.

DETAILED DESCRIPTION OF THE INVENTION

The improved methylene chloride formulation for use as a photoresist stripper contains methanol and methyl formate, each employed at a concentration of from about one to about ten percent by volume based on the total volume of the composition. The composition can optionally contain a stabilizer for the methylene chloride such as a vicinal epoxide, e.g. propylene oxide. Amines are frequently used as an aid in stripping, e.g. isopropylamine. Also useful are cyclohexylamine and triethylamine. Such amines are known to be contained in some current commercial stripper formulations.

Blends according to the invention were tested in the following ways:

Test 1—Drop Test

A fifty microliter drop of the test blend (1-25% additive(s) in methylene chloride) is placed on the crosslinked photoresist film contained on a printed circuit board. The solvent-film area is observed under a 150X microscope to determine the time (in seconds) necessary to fracture and lift the film from the board. Lower times are preferred in commercial operations.

This test was run with a number of possible additive candidates using commercially-prepared photoresist-covered printed circuit boards. These boards utilized crosslinked photoresist film.* Results from these tests are shown in Tables I and II. All of the additives were tested in an inhibited grade of methylene chloride to which was added 0.1 volume % isopropylamine.

*A commercially available film manufactured by E. I. duPont de Nemours Co., Inc.

TABLE I*

| Additive** | Drop Time (sec) | | | | |
|---|---|---|---|---|---|
| (%) | 5 | 7.5 | 10 | 15 | 25 |
| Me Form. | 8.3 | 8.8 | 10.1 | 11.3 | 10.2 |
| MeOH | 10.3 | 10.0 | 9.6 | 10.4 | 11.5 |
| i-PrOH | 11.7 | 12.5 | 12.8 | 14.1 | 16.7 |
| Me Acet. | 13.1 | 13.2 | 13.5 | 15.9 | 20 |

TABLE II*

| Additive** | Drop Time (sec) | | | |
|---|---|---|---|---|
| (%) | 5 | 7.5 | 10 | 15 |
| Me Form. | 11.8 | 12.5 | 12.8 | 14.5 |
| Et Form | 14.8 | 15.0 | 15.3 | 16.5 |
| MeOH | 12.4 | 12.3 | 12.2 | 11.4 |
| i-PrOH | 12.1 | 12.3 | 13.1 | 13.4 |
| Me Acet. | 14.2 | 14.9 | 15.0 | 18.0 |
| THF | 12.7 | 12.5 | 13.3 | 16.4 |

*Table I shows results using a commercially available polymethylmethacrylate film and Table II a similar, but not identical film, manufactured by the same company.
**MeOH = methyl alcohol
i-PrOH = isopropyl alcohol
Me Form. = methyl formate
Me Acet. = methyl acetate
Et Form. = ethyl formate
THF = tetrahydrofuran

Test 2—Spray Unit Test

A spray test was conducted utilizing a steel spray unit which was a laboratory scale version of the apparatus used in industry to strip resist film. Two-gallon quantities of test blends suggested from the preliminary screening were used in the spray unit. Solvent spray at 20 psig and 23°-24° C. was then directed onto the suspended boards for 10-15 seconds. The boards were weighed before and after stripping. Weight differences in amount of removed photoresist were compared with a standard* using the formula:

$$\% \text{ difference} = \frac{\text{wt. test blend} - \text{wt. standard}}{\text{wt. standard}} \times 100$$

A positive % value indicated more complete stripping and a negative value less complete stripping when compared with the performance of the standard stripper blend.

*The standard was a commercially available stripper containing 7.5% methanol and 0.10% isopropylamine in methylene chloride (inhibited grade), volume basis.

The 4"×4" test boards were prepared by a commercial fabricator, using a commercially available photoresist resin** film and a test pattern consisting of numerous lines of varying widths and spacing. These boards, which were tin-lead plated, were ready for stripping as received.

**Major component is a polymethylmethacrylate resin.

Several compositions of methylene chloride containing different amounts of methanol and methyl formate were used in the above described spray test. A timed spray of 10-second duration was used. Methanol and methyl formate were each employed in amounts of 1.0, 2.5 and 4.0 volume percent in the methylene chloride (inhibited grade) based on the total volume of solvent and additives. Isopropylamine was present at 0.1 volume percent in each formulation total basis. Results of strippability of each formulation are shown as percent better (+) or worse (−) than a standard methylene chloride stripper in Table III.

TABLE III

|  |  | % MeOH | | |
|---|---|---|---|---|
|  |  | 1.0 | 2.5 | 4.0 |
| % Me Form. | 1.0 | −17.5 | −10.7 | +7.4 |
|  | 2.5 | −1.6 | +13.8 | +13.2 |
|  | 4.0 | +5.3 | +4.4 | +4.4 |

Evaporation and corrosion tests were also performed on these compositions.

Two tests were done for evaporation. In the first, 300 ml test solution was prepared, placed in a beaker at room temperature in the hood, and analyzed at various times for additive composition using gas chromatography. Results are shown in Table IV. In the second test, two gallons of test solution were placed in the spray unit with the lid slightly opened. The unit was operated at 20 psig for a period of 60 minutes. Again, the concentrations of the additives were evaluated at various times. For this test at the end of one hour the concentration of methyl formate was about 2.85% and that of the methanol was about 2.30%, the initial concentrations being 3.0 volume percent each, which showed only slight loss of components from the mixture.

TABLE IV

| Time (min.) | *Composition (Vol. %) | | Volume (ml) |
|---|---|---|---|
|  | MeOH | Me Form. |  |
| 0 | 3.00 | 3.00 | 300 |
| 20 | 2.80 | 2.85 | 275 |
| 60 | 2.55 | 2.80 | 215 |
| 90 | 2.45 | 2.85 | 175 |
| 120 | 2.00 | 2.75 | 140 |
| 153 | 1.60 | 2.70 | 100 |

*This composition also contained 0.1% isopropylamine by volume, but since its levels were unimportant with respect to strippability its analysis was omitted.

A copper corrosion study consisted of refluxing 100 ml of test solvent blend with a 0.5×2.45 inch copper coupon for seven days. Triplicate determinations were run for each solvent blend. Gas chromatography analysis was done on each sample after the seven days. The corrosion rate of the copper coupon was expressed in mils penetration per year (MPY) using the following formula $$MPY = \text{coupon wt (mg) loss/sq in/day (22.3/8.93)}$$

$$MPY = \frac{\text{wt (MG) loss (22.3)}}{2.45(7)(8.93)}$$

Results for formulations of a commercial blend (A) and one according to the invention (B) under the conditions of the above test are shown below.

|  | Formulation (Vol. %) | | Corrosion (MPY) |
|---|---|---|---|
| A | MeOH | 7.5 | 1.01 |
|  | IPA | 0.1 |  |
| B | MeOH | 2.5 | 0.1 |
|  | Me Form. | 2.5 |  |
|  | IPA | 0.1 |  |

The amine can present a slight problem of copper tarnishing and solvent discoloration if allowed to stand for a minimum of 12 hours at room temperature in the presence of the metal. This may not be a significant problem with respect to the boards, however, since the solvent contacts the copper circuit boards for only two to three minutes in actual commercial use. Since industrial equipment typically uses copper piping, however, this phenomenon can affect equipment life. It is interesting to note that use of a 0.1 volume percent triethylamine to replace isopropylamine in the B formulation greatly decreased the solvent discoloration problem in the room temperature copper corrosion tests. The amine adds nothing to the strippability characteristics of the formulation and if eliminated completely avoids the corrosion and discoloration of the copper.

The compositions according to the present invention are those containing from about 1 to about 10 volume percent each of methanol and methyl formate, with the proviso that the total of methanol and methyl formate be at least 5 and not more than about 10 volume percent of the total composition. The composition may also contain an amine.

We claim:

1. A composition suitable for stripping cross-linked photoresist polymer which comprises methylene chloride containing methanol and methyl formate, each in amounts of from about 1 to about 10 percent by volume of the total mixture, providing that the total amount of methanol and methyl formate is at least about 5 and not more than about 10 volume percent of the total mixture.

2. The composition of claim 1 wherein the methanol and methyl formate are each present in an amount of from about 1 to about 5 volume percent of the total mixture.

3. The composition of claim 2 wherein the methanol and methyl formate are present at about 2.5 to about 5 volume percent each.

4. The composition of claim 1 which additionally contains an amine as an aid in stripping.

5. The composition of claim 2 which additionally contains an amine as an aid in stripping.

6. The composition of claim 5 wherein the amine is a lower aliphatic amine having from 3 to 6 carbon atoms.

7. The composition of claim 5 wherein the amine is isopropylamine.

8. The composition of claim 6 wherein the amine is cyclohexylamine.

9. The composition of claim 6 wherein the amine is triethylamine.

* * * * *